United States Patent
Naito et al.

(10) Patent No.: US 7,101,197 B2
(45) Date of Patent: Sep. 5, 2006

(54) PRESS-FIT TERMINAL, PRINTED BOARD CONNECTION STRUCTURE USING THE PRESS-FIT TERMINAL, AND ELECTRICAL CONNECTION BOX

(75) Inventors: Tsutomu Naito, Yokkaichi (JP); Tatsuya Oka, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 0 days.

(21) Appl. No.: 10/560,602

(22) PCT Filed: May 31, 2004

(86) PCT No.: PCT/JP2004/007498

§ 371 (c)(1),
(2), (4) Date: Dec. 13, 2005

(87) PCT Pub. No.: WO2004/112196

PCT Pub. Date: Dec. 23, 2004

(65) Prior Publication Data

US 2006/0154499 A1    Jul. 13, 2006

(30) Foreign Application Priority Data

Jun. 13, 2003 (JP) .............................. 2003-169971

(51) Int. Cl.
*H01R 12/00* (2006.01)
(52) U.S. Cl. .................. 439/75; 439/76.2; 439/949
(58) Field of Classification Search .................. 439/74, 439/75, 76.2, 751, 943, 949
See application file for complete search history.

(56) References Cited

U.S. PATENT DOCUMENTS

| | | | | |
|---|---|---|---|---|
| 4,781,621 A | * | 11/1988 | Sugiyama et al. .......... | 439/559 |
| 5,761,050 A | | 6/1998 | Archer | |
| 5,823,819 A | * | 10/1998 | Kondo et al. ................ | 439/487 |
| 6,503,090 B1 | * | 1/2003 | Onizuka ....................... | 439/75 |
| 6,761,567 B1 | * | 7/2004 | Onizuka et al. ............ | 439/76.2 |
| 2002/0001983 A1 | * | 1/2002 | Torii .......................... | 439/76.2 |

FOREIGN PATENT DOCUMENTS

| | | |
|---|---|---|
| JP | U 2-20368 | 2/1990 |
| JP | A 3-263771 | 11/1991 |
| JP | A 7-297562 | 11/1995 |
| JP | A 8-195568 | 7/1996 |

* cited by examiner

*Primary Examiner*—Tho D. Ta
(74) *Attorney, Agent, or Firm*—Oliff & Berridge, PLC

(57) ABSTRACT

In printed boards arranged in a vertical relationship, outer peripheral portions of an upper printed board are projected outward from outer peripheral portions of a lower printed board. Conductive bodies with terminal holes are arranged side by side on the upper and the lower printed boards along peripheral edges of the boards. Press-fit terminals are arranged in row arrangement along the outer peripheral portions of the printed boards. Each of the press-fit terminals is pressed from below into terminal holes of the two upper and lower printed boards with a long first vertical portion outside and a short second vertical portion inside. This results that a press-fit portion of the second vertical portion is pressed and brought into contact with a terminal hole in a conductive body on a peripheral edge of the lower printed board, a press-fit portion of the first vertical portion is pressed and brought into contact with a terminal hole in a conductive body on a peripheral edge of the upper printed board, and a horizontal portion is supported from below by a step-like portion projected from a printed board retaining case.

6 Claims, 13 Drawing Sheets

[Prior Art]

PRESS-FIT TERMINAL, PRINTED BOARD CONNECTION STRUCTURE USING THE PRESS-FIT TERMINAL, AND ELECTRICAL CONNECTION BOX

TECHNICAL FIELD

The present invention relates to a press fit terminal, the construction of connecting printed boards to each other by using the press fit terminal, and an electric junction box. More particularly, in the present invention, electric conductors of the printed boards are electrically connected to each other.

In recent years, with an increase of electric component parts to be mounted on vehicles, printed boards are used as circuit component parts constituting circuits inside the electric junction box.

BACKGROUND ART

As shown in FIG. 13, the electric junction box 1 proposed in Japanese Patent Application Laid-Open No. 7-297562 accommodates the first printed board 5 and the second printed board 6 in the box composed of the upper case 2 and the lower case 3, with the insulating sheet 4 interposed between the upper case 2 and the lower case 3. Terminal holes 5a and 6a are formed on the first printed board 5 and the second printed board 6 respectively. Connection pins 7 are inserted through the terminal holes 5a and 6a and soldered thereto.

Patent document 1: Japanese Patent Application Laid-Open No. 7-297562

DISCLOSURE OF THE INVENTION

Problems to be Solved by the Invention

However, in the electric junction box 1, by merely inserting the connection pins 7 connecting the electric conductor of the first printed board 5 and that of the second printed board 6 with each other through the terminal holes 5a and 6a, the connection pins 7 are not fixed to the terminal holes 5a and 6a. Thus it is necessary to solder the connection pins 7 to the first and second printed boards 5, 6. Hence the electric junction box 1 has a problem that assembling operability is not good. The electric junction box 1 has another problem that because the connection pins are soldered to the electric conductors, it is not easy to cope with a specification of changing electric conductors to be connected to each other.

The present invention has been made in view of the above-described problem. Therefore it is an object of the present invention to facilitate an electrical connection by fixing press fit terminals to electric conductors or the like of printed boards without soldering the press fit terminals to the printed boards.

Means for Solving the Problems

To solve the above-described problem, the present invention provides a press fit terminal for electrically connecting electric conductors of printed boards spaced at an interval to each other, electric conductors of the printed boards and bus bars to each other or the bus bars to each other, wherein the press fit terminal is formed by bending a rod-shaped material made of conductive metal and has a long first vertical part, a horizontal part bent at a lower end of the first vertical part and extended in parallel with the printed boards or the bus bars, and a short second vertical part bent upward at a leading end of the horizontal part and extended in confrontation with the first vertical part; and an upper portion of the first vertical part is set as a press fit portion to be pressed into a terminal hole of the printed board or a terminal hole of the bus bar disposed at an upper position, and an upper portion of the second vertical part is set as a press fit portion to be pressed into a terminal hole of the printed board or a terminal hole of the bus bar disposed at a lower position.

In the above-described construction of the press fit terminal, because the press fit portion of the first vertical part and that of the second vertical part are formed at horizontally shifted positions, the press fit portion of the first vertical part can be pressed into the terminal hole of the printed board at the upper position or the terminal hole of the bus bar at the upper position without inserting the press fit portion of the first vertical part into the terminal hole of the printed board at the lower position or the terminal hole of the bus bar at the lower position. Thereby by using the press fit terminal, it is possible to connect the electric conductors of the printed boards, the electric conductor of the printed board and the bus bar or the bus bars easily.

The conductive metal is stricken in the widthwise direction thereof to form the press fit portion. Therefore by merely pressing the press fit portions into the terminal holes of the printed boards respectively, the printed boards can be connected to each other. Thus it is unnecessary to solder the press fit terminal to the printed boards.

The present invention provides a construction of connecting printed boards by using a press fit terminal, wherein by using a press fit terminal according to claim 1, forming a conductive layer connected with an electric conductor on an inner peripheral surface of a terminal hole of each of said printed boards, and pressing the press fit portions of the press fit terminal into the terminal holes, the press fit terminal is electrically connected with the electric conductors of the printed boards.

In the above-described construction, when the press fit portions of the press fit terminal are pressed into the terminal holes of the printed boards, the press fit portions are connected to the electric layers connected to the electric conductors of the printed boards. Thus by using the press fit terminal, it is possible to securely electrically connect the electric conductors of the printed boards to each other.

In the printed boards, a peripheral portion of the upper printed board is projected outward beyond a peripheral portion of the lower printed board, and the electric conductors, provided with the terminal holes respectively, are arranged side by side on the upper and lower printed boards along peripheries thereof;

a plurality of the press fit terminals are arranged in a row along the peripheral portions of the printed boards, and with a first vertical part of each of the press fit terminals disposed outside and a second vertical part thereof disposed inside, the press fit terminals are pressed into the terminal holes of the upper and lower printed boards from below in such a way that the press fit portion of the second vertical part of each press fit terminal is pressed into and brought into contact with one of the terminal holes formed on the periphery of the lower printed board and that the press fit portion of the first vertical parts of each press fit terminal is pressed into and brought into contact with one of the terminal holes formed on the periphery of the upper printed board.

The above-described construction prevents the first vertical part of the press fit terminal connected with the electric conductor of the upper printed board and the lower printed board from interfering with each other. Thereby it is unnecessary to form a through-hole through which the first vertical part is inserted on the lower printed board. Further only the press fit portions of the first and second vertical parts are pressed into the terminal holes of the printed boards. Thus it is possible to facilitate the connection of the press fit terminal to the printed boards.

Further the printed boards have an equal size; a cut-off portion through which the first vertical part of the press fit terminal is inserted is formed on the lower printed board; and electric conductors having the terminals holes formed thereon respectively are arranged side by side along the peripheries of the upper and lower printed boards or the cut-off portions, a plurality of the press fit terminals are arranged in a row along the peripheral portions of the printed boards, and with a first vertical part of each of the press fit terminals disposed outside and a second vertical part thereof disposed inside, the press fit terminals are pressed into the terminal holes of the upper and lower printed boards from below in such a way that the press fit portion of the second vertical part of each press fit terminal is pressed into and brought into contact with one of the terminal holes formed on the periphery of the lower printed board, that a lower portion of the press fit portion of the first vertical part of each of the press fit terminals is inserted through the cut-off portion, and that each of the press fit portions is pressed into and brought into contact with one of the terminal holes formed on the periphery of the upper printed board.

The above-described construction facilitates the connection of the press fit terminal to the printed boards. Further by setting the size of the printed boards to an equal size, the area of the lower printed board is sufficiently large. Therefore it is easy to form a circuit pattern and accomplish high-density wiring.

The present invention provides an electric junction box accommodating printed boards connected to each other with the press fit terminals, wherein a horizontal part of each of the press fit terminals is supported with a stepwise part projected from a bottom wall of a printed board holding case or a stepwise part projected from a partitioning wall formed inside the electric junction box; and the printed boards are supported with a supporting rib projected from the bottom wall of the printed board holding case or a supporting rib projected from the partitioning wall formed inside the electric junction box.

The above-described construction allows the horizontal part of the press fit terminal disposed at its lower end to be supported with the stepwise part projected from the bottom wall of the printed board holding case or the stepwise part projected from the partitioning wall formed inside the electric junction box. Therefore by merely pressing the press fit terminal into the terminal holes of the printed boards, the electric conductor of the printed boards can be connected to each other. Further after the printed boards are connected, the press fit terminal is not removed from the terminal holes. Thus it is possible to improve the reliability in the electrical connection. Further because the stepwise part for supporting the press fit terminal is projected from the bottom wall of the printed board holding case or from the partitioning wall, the press fit terminal can be mounted at a desired position of the electric junction box such as a central position thereof.

Particularly, in fitting the press fit terminal in a connector of an external circuit, with the upper end of the press fit terminal projected into a connector accommodation part provided inside the electric junction box, a load is applied to the press fit terminal. But the press fit terminal is supported from below by the stepwise part. Thus it is possible to prevent the press fit terminal from being removed from the terminal holes of the printed boards.

The above-described connection construction facilitates the electric conductors of the printed boards to be easily connected to each other. Thus it is possible to accommodate a plurality of printed boards inside the electric junction box. Thereby the electric junction box is allowed to have a high density, be compact, and have a low cost.

Effect of the Invention

As apparent from the foregoing description, according to the present invention, because the press fit portion of the first vertical part of the press fit terminal and that of the second vertical part thereof are formed at horizontally shifted positions, the press fit portion of the first vertical part can be pressed into the terminal hole of the printed board at the upper position or the terminal hole of the bus bar at the upper position without inserting the press fit portion of the first vertical part into the terminal hole of the printed board at the lower position or the terminal hole of the bus bar at the lower position. Thereby by using the press fit terminal, it is possible to connect the electric conductors of the printed boards, the electric conductor of the printed board and the bus bar or the bus bars easily.

The conductive metal is stricken in the widthwise direction thereof to form the press fit portion. Therefore by merely pressing the press fit portions into the terminal holes of the printed boards respectively or the terminal holes of the bus bars respectively, the printed boards can be connected to each other. Thus it is unnecessary to solder the press fit terminal to the printed boards.

The press fit terminal is electrically connected with the electric conductors of the printed boards by forming The conductive layer connected with the electric conductor on the inner peripheral surface of the terminal hole of each of the printed boards, and pressing the press fit portions of the press fit terminal into the terminal holes. Thus by using the press fit terminal, it is possible to securely electrically connect the electric conductors of the printed boards to each other.

In the printed boards, the peripheral portion of the upper printed board is projected outward beyond the peripheral portion of the lower printed board, and the electric conductors, provided with the terminal holes respectively, are arranged side by side on the upper and lower printed boards along the peripheries thereof. The above-described construction prevents the first vertical part of the press fit terminal connected with the electric conductor of the upper printed board and the lower printed board from interfering with each other. Thereby it is unnecessary to form a through-hole through which the first vertical part is inserted on the lower printed board. Further only the press fit portions of the first and second vertical parts are pressed into the terminal holes of the printed boards. Thus it is possible to facilitate the connection of the press fit terminal to the printed boards.

Further the horizontal part of each of the press fit terminals is supported with the stepwise part projected from the bottom wall of the printed board holding case or the stepwise part projected from the partitioning wall formed inside the electric junction box. Therefore by merely pressing the press fit terminal into the terminal holes of the printed boards, the electric conductor of the printed boards can be connected to each other. Further after the printed boards are connected, the press fit terminal is not removed from the terminal holes. Thus it is possible to improve the reliability in the electrical connection. Further because the stepwise part for supporting the press fit terminal is projected from the bottom wall of the printed board holding case or from the partitioning wall, the press fit terminal can be mounted at a desired position of the electric junction box such as a central position thereof.

The above-described connection construction facilitates the electric conductors of the printed boards to be easily connected to each other. Thus it is possible to accommodate a plurality of printed boards inside the electric junction box. Thereby the electric junction box is allowed to have a high density, be compact, and have a low cost.

EXPLANATION OF REFERENCE NUMERALS AND SYMBOLS

Figure 1A:
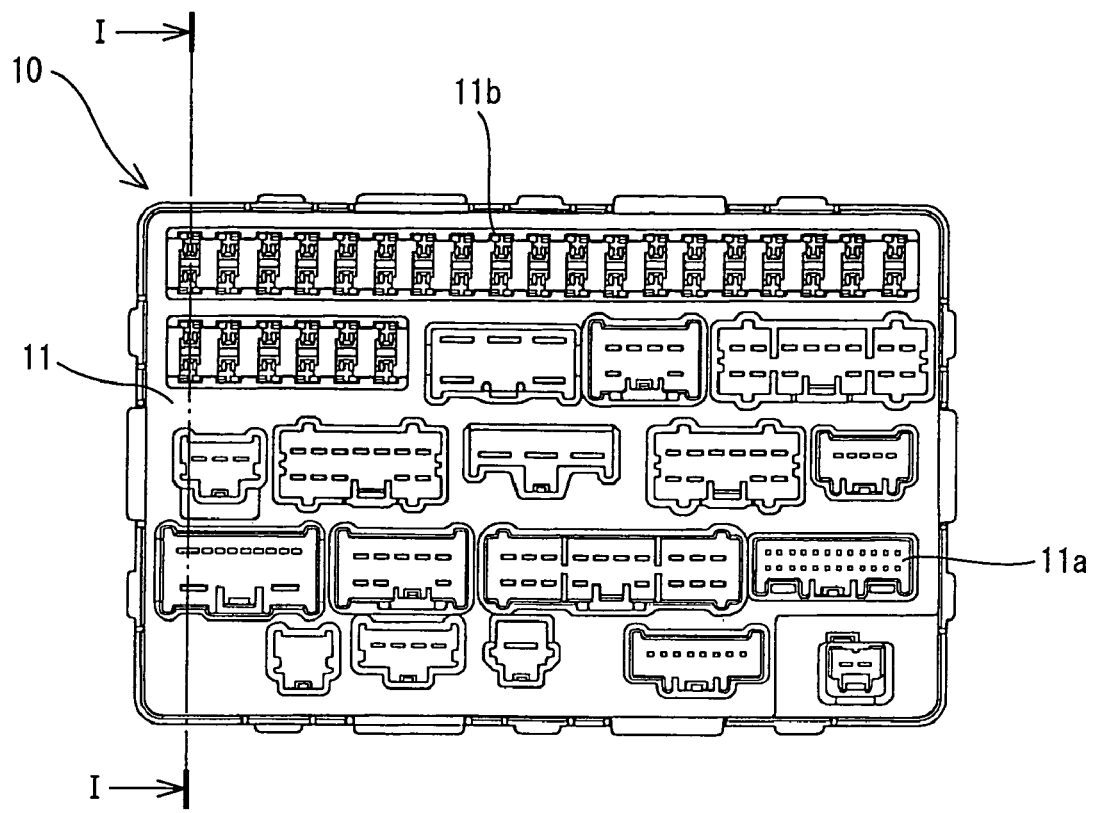
FIG. 1 shows an electric junction box of the first embodiment of the present invention, in which (A) is a plan view and (B) is a bottom view.

10: electric junction box
11: upper case
11a: connector accommodation part at upper case side
12: printed board holding case
12b: stepwise part
13: lower case
13a: connector accommodation part at lower case side
14: first intermediate case
15: second intermediate case
16: insulating sheet
20: press fit terminal
21: first vertical part
22: horizontal part
23: second vertical part
24, 25: press fit portion
31: first printed board
31a, 32a, 33a: electric conductor
31b, 32b, 33b: terminal hole
31c: conductive layer
32: second printed board
32e', 33e': cut-off portion for terminal 33: third printed board
32f': cut-off portion for stepwise part
40: bus bar
50: partitioning wall
51: stepwise part
61: first bus bar
62: second bus bar

BEST MODE FOR CARRYING OUT THE INVENTION

The embodiments of the present invention will be described below with reference to drawings.

FIGS. 1 through 6 show the first embodiment of the present invention. In an electric junction box 10, a lower case 13 is coupled to the side of a printed board holding case 12 in such a way that the lower case 13 covers the printed board holding case 12 coupled to an upper case 11.

Figure 1B:
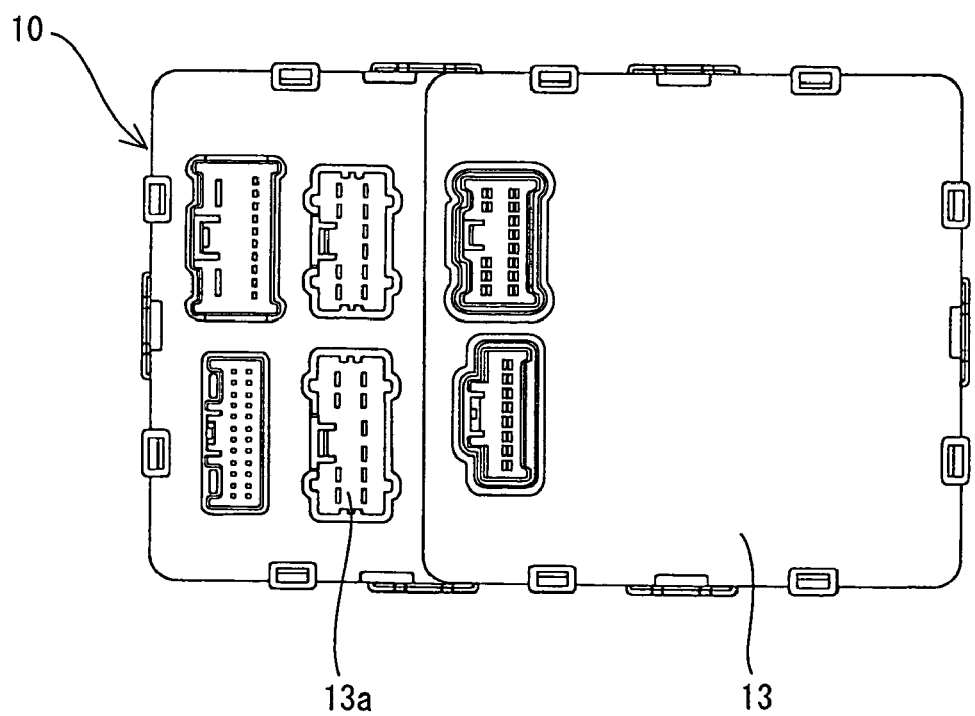

As shown in FIG. 1 (A), a plurality of connector accommodation parts 11a and a plurality of fuse accommodation parts 11b are provided on an upper surface of the upper case 11. A peripheral wall 11c of the upper case 11 is extended downward to the printed board holding case 12.

Figure 2:
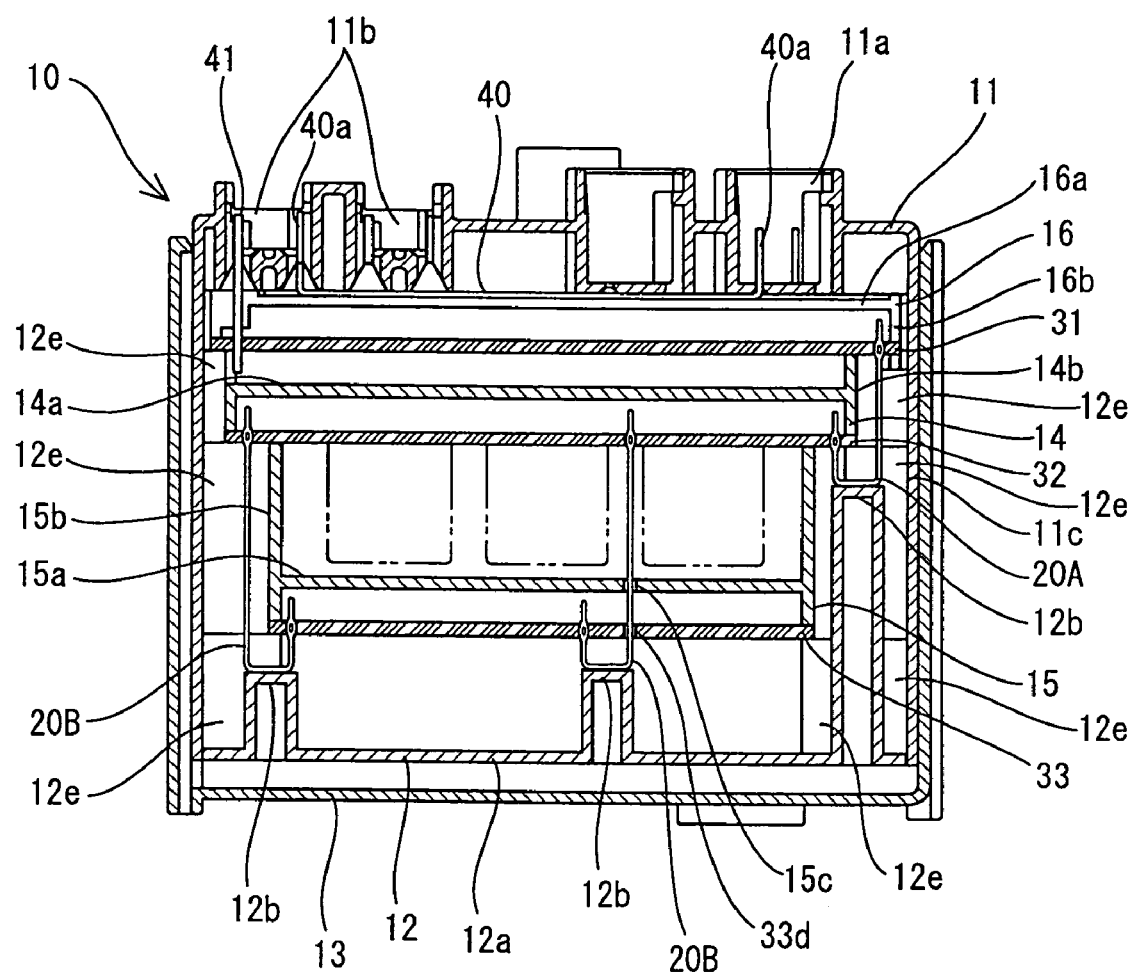
FIG. 2 is a sectional view of the electric junction box of the first embodiment taken along a line I—I.

As shown in FIG. 2, in the printed board holding case 12, a required portion of a bottom wall 12a is projected to the inner side of the box to form a stepwise part 12b for supporting a press fit terminal. Further a supporting rib 12e is formed along a side wall of the printed board holding case 12 to support printed boards accommodated inside the box from below.

As shown in FIG. 1 (B), a plurality of connector accommodation parts 13a is provided on a lower surface of the lower case 13.

As shown in FIG. 2, two intermediate cases are mounted inside the box composed of the upper case 11 and the printed board holding case 12. A first intermediate case 14 and a second intermediate case 15 are constructed of partitioning walls 14a, 15a respectively partitioning the inside of the box into the side of the upper case 11 and the side of the printed board holding case 12 and peripheral walls 14b, 15b projected vertically from peripheries of the partitioning walls 14a, 15a respectively.

A through-hole 15c through which a press fit terminal 20 is inserted is formed at required position of a partitioning wall 15a.

Over the first intermediate case 14, the first printed board 31 whose peripheral portion is fixed to an upper end of the peripheral wall 14b of the first intermediate case 14 is disposed. Disposed between the first intermediate case 14 and the second intermediate case 15 is the second printed board 32 fixed to a lower end of the peripheral wall 14b of the first intermediate case 14 and to an upper end of the peripheral wall 15b of the second intermediate case 15. Disposed below the second intermediate case 15 is the third printed board 33 whose peripheral portion is fixed to a lower end of the peripheral wall 15b of the second intermediate case 15.

Figure 3:
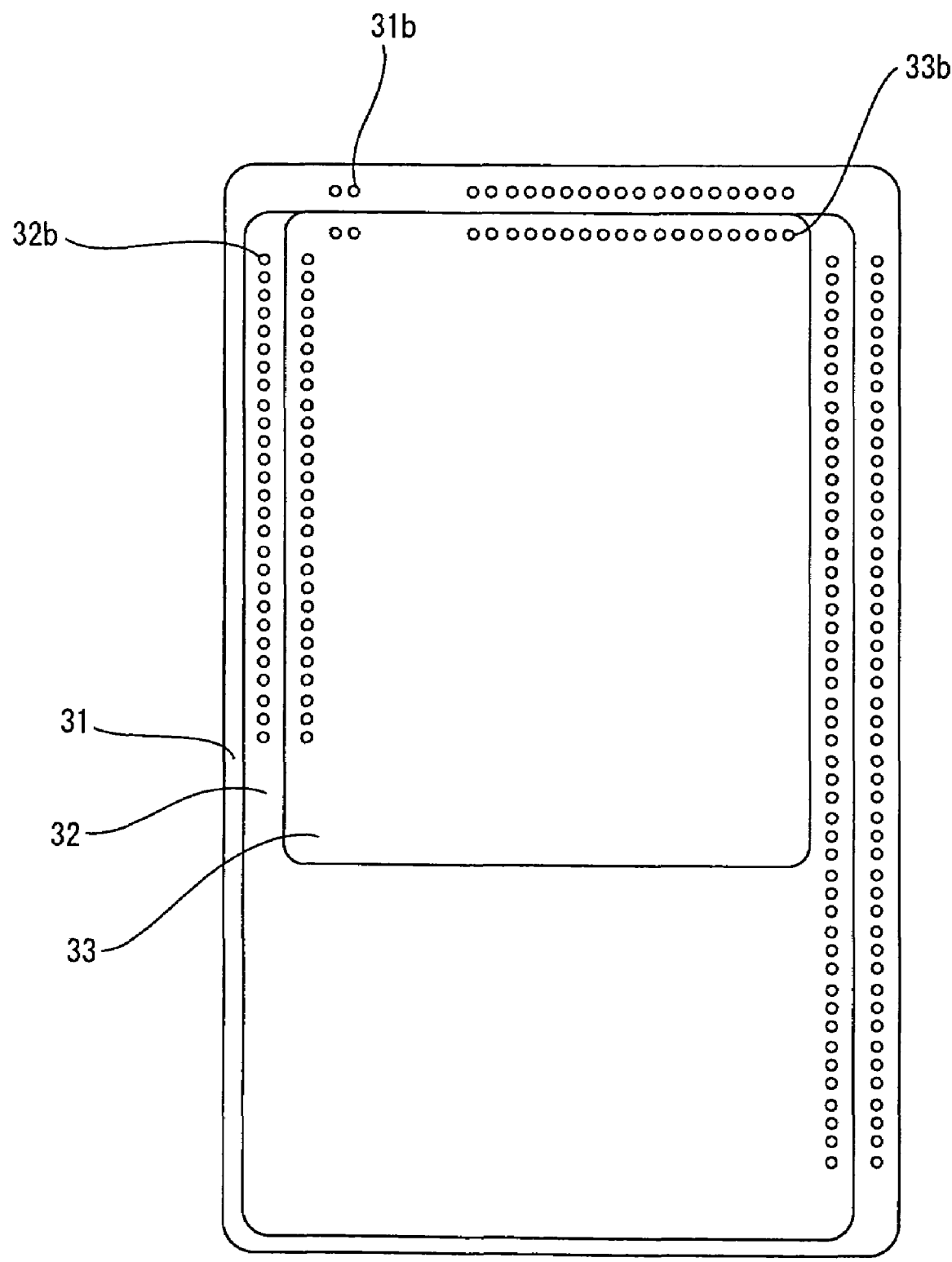
FIG. 3 is a bottom view showing a state in which first through third printed boards of the first embodiment are disposed.
Figure 6:
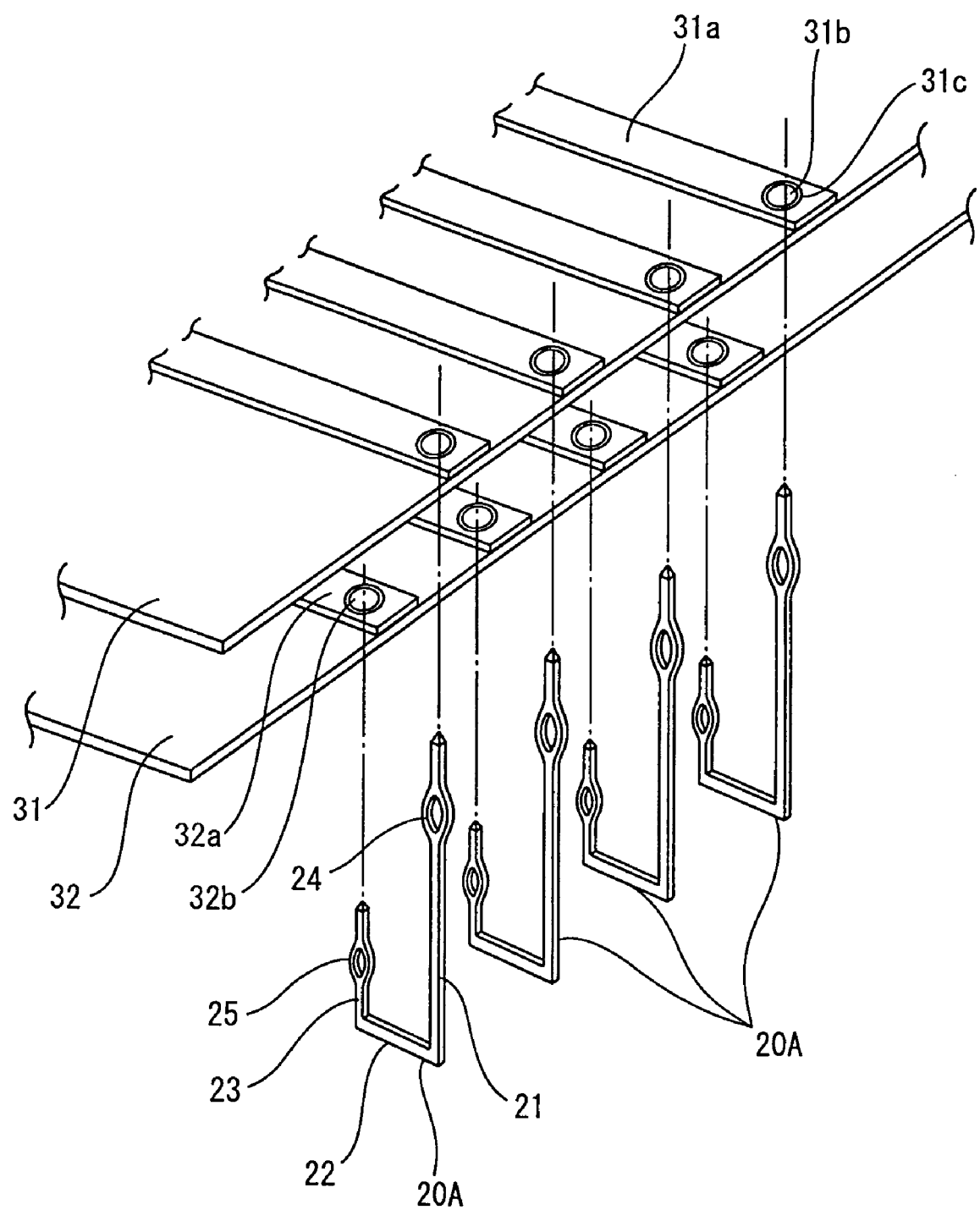
FIG. 6 shows a method of pressing the press fit terminal into printed boards.

As shown in FIG. 3, in the first through third printed boards 31, 32, and 33, the peripheral portion of the upper first printed board 31 is projected outward beyond the peripheral portion of the lower second printed board 32. Similarly, the peripheral portion of the upper second printed board 32 is projected outward beyond the peripheral portion of the lower third printed board 33. As shown in FIG. 6, electric conductors 31a, 32a, and 33a having terminal holes 31b, 32b, and 33b formed therethrough respectively along a peripheral edge thereof are arranged side by side on the first through third printed boards 31, 32, and 33 respectively. In the first through third printed boards 31, 32, and 33, only the terminal holes 31*b*, 32*b*, and 33*b* formed on the peripheral edge of the electric conductors 31*a*, 32*a*, and 33*a* respectively are shown in FIG. 3, but terminal holes and electric conductors formed at an inner side thereof are not shown.

Figure 4:
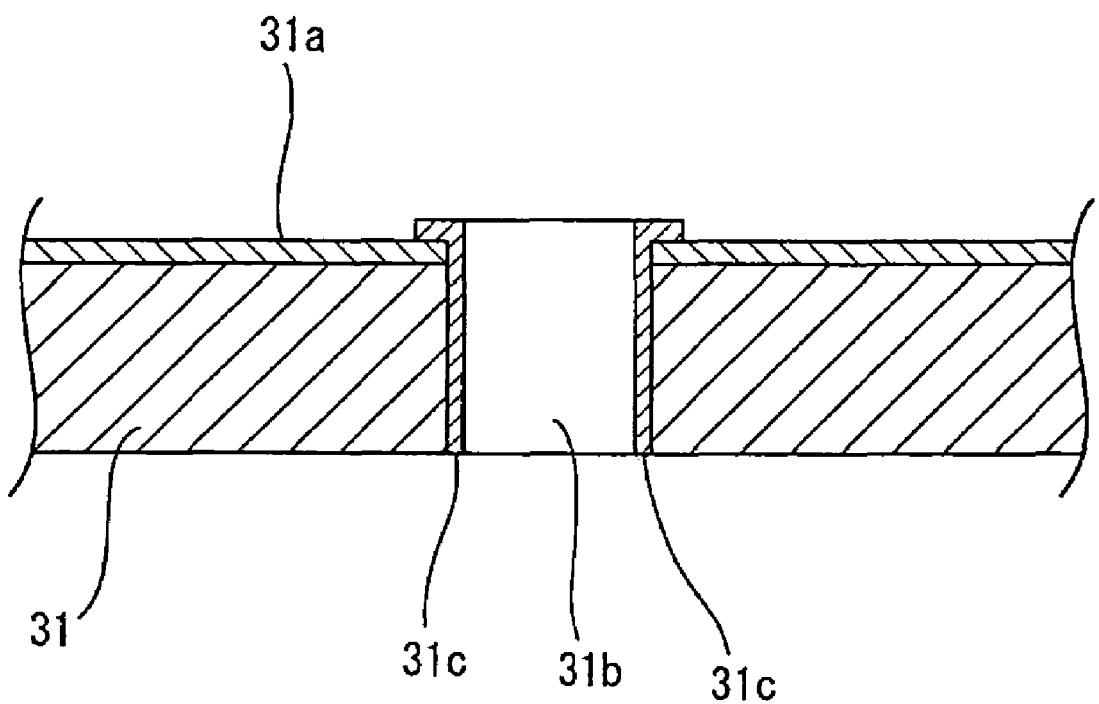
FIG. 4 is a sectional view in which main parts of a terminal hole of a printed board are enlarged.

As shown in FIG. 4, the terminal hole 31*b* formed on the electric conductor 31*a* of the first printed board 31 is copper plated on an entire inner peripheral surface of the terminal hole 31*b* and on the surface of the printed board 31. The copper plated surface of the first printed board 31 is tin plated or solder plated to form a conductive layer 31*c*. An upper portion of the conductive layer 31*c* is joined with the electric conductor 31*a*. The terminal holes 32*b* and 33*b* of the second and third printed boards 32 and 33 have a construction respectively similar to that of the terminal hole 31*b*.

Figure 5:
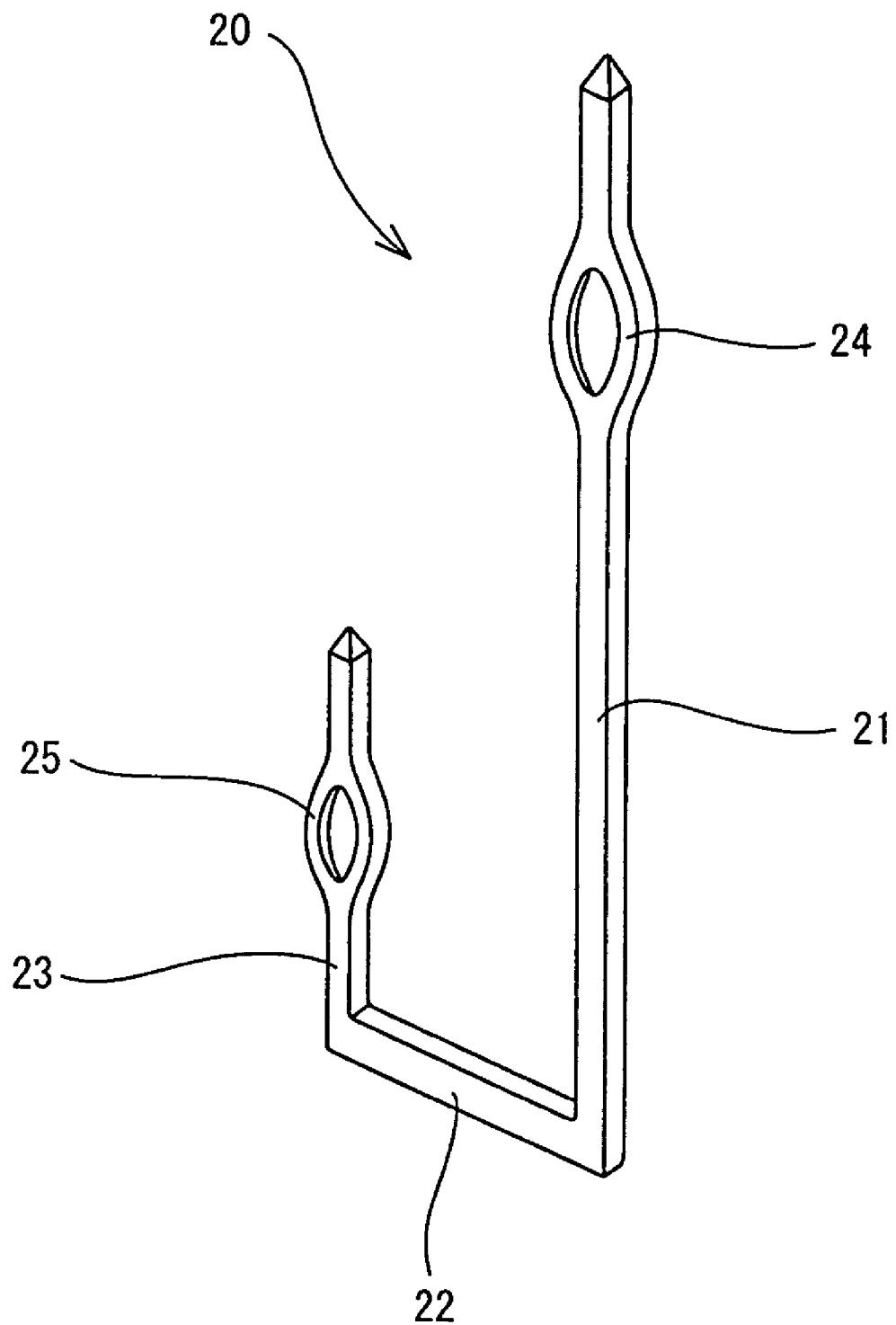
FIG. 5 is a perspective view of a press fit terminal.

As shown in FIG. 5, the press fit terminal 20 connecting the electric conductor 31*a* of the first printed board 31 and the electric conductor 32*a* of the second printed board 32 to each other and the press fit terminal 20 connecting the electric conductor 32*a* of the second printed board 32 and the electric conductor 33*a* of the third printed board 33 to each other are formed by bending a rod-shaped material made of conductive metal. The press fit terminal 20 has a long first vertical part 21, a horizontal part 22 bent at a lower end of the first vertical part 21, and a short second vertical part 23 bent upward at a leading end of the horizontal part 22. Press fit parts 24, 25 are formed at a leading end of the first vertical part 21 and at a leading end of the second vertical part 23 respectively. The press fit parts 24, 25 are shaped rhombically by striking the center thereof in the widthwise direction thereof to thin the center thereof so that the center thereof can be decreased in its diameter and by bending right and left side portions thereof outward in the shape of a letter "<". The leading end of each of the press fit parts 24, 25 decreases taperingly in the diameter thereof.

The electric conductor 31*a* of the first printed board 31 and the electric conductor 32*a* of the second printed board 32 are connected with each other with a press fit terminal 20A. The electric conductor 32*a* of the second printed board 32 and the electric conductor 33*a* of the third printed board 33 are connected with each other with a press fit terminal 20B.

As shown in FIG. 6, a plurality of the press fit terminals 20A is arranged side by side along the peripheral portion of the first and second printed boards 31, 32. The press fit terminals 20A are pressed into the terminal holes 31*b*, 32*b* from the lower end thereof, with the first vertical part 21 of each press fit terminal 20A disposed outward and the second vertical part 23 thereof disposed inward. At this time, the press fit portion 25 of the second vertical part is pressed into the terminal hole 32*b* disposed on the periphery of the lower second printed board 32, and the press fit portion 24 of the first vertical part 21 is pressed into the terminal hole 31*b* disposed on the periphery of the upper first printed board 31. Thereby the electric conductor 31*a* of the first printed board 31 and the electric conductor 32*a* of the second printed board 32 are connected to each other.

The electric conductor 32*a* of the second printed board 32 and the electric conductor 33*a* of the third printed board 33 are connected to each other in a similar method by using the press fit terminal 20B. In this embodiment, the first vertical part 21 of the press fit terminal 20B is set longer than the first vertical part 21 of the press fit terminal 20A.

By using the press fit terminal 20, the electric conductor 32*a* of the second printed board 32 and the electric conductor 33*a* of the third printed board 33 are connected to each other not only on the peripheral edge of the second and third printed boards 32, 33 but also at approximately a central position of the second and third printed boards 32, 33. That is, as shown in FIG. 2, the press fit portion 25 of the second vertical part 23 of the press fit terminal 20B is pressed into the terminal hole 33*b* formed on the electric conductor 33*a* of the third printed board 33, whereas a lower portion of the first vertical part 21 is penetrated through the through-hole 33*d* formed on the third printed board 33 and the through-hole 15*c* formed on the second intermediate case 15. Thereby the press fit portion 24 located at an upper position is pressed into the terminal hole 32*b* of the second printed board 32.

By accommodating the first through third printed boards 31, 32, and 33 connected to each other with the press fit terminals 20 inside the box composed of the upper case 11 and the printed board holding case 12 and coupling the upper case 11 and the printed board holding case 12 to each other, the stepwise parts 12*b* projected from the bottom wall 12*a* of the printed board holding case 12 contact the horizontal part 22 of the press fit terminal 20. Thereby the press fit terminal 20 is supported from below.

As shown in FIG. 2, an insulating sheet 16 disposed above the first printed board 31 is constructed of a partitioning wall 16*a* partitioning the inside of the box into the side of the upper case 11 and the side of the printed board holding case 12 and a peripheral wall 16*b* projected vertically from a periphery of the partitioning wall 16*a*. A lower end of the peripheral wall 16*b* is fixed to the peripheral edge of the first printed board 31. Bus bars 40 are disposed on an upper surface of the partitioning wall 16*a* of the insulating sheet 16. Required portions of the bus bars 40 are bent upward to form tabs 40*a*. The tabs 40*a* are projected into the connector accommodation parts 11*a* and the fuse accommodation parts 11*b* provided in the upper case 11 to connect them to a connector and fuses (not shown) of an external circuit.

Lower portions of terminals 41 made of linear conductive metal are penetrated through the terminal holes of the first printed board 31 and soldered to connect the terminals 41 to the electric conductors 31*b*, whereas upper portions of the terminals 41 are projected into the fuse accommodation parts 11*b* of the upper case 11.

A plurality of electronic parts 42 are mounted on a lower surface of the second printed board 32.

In the above-described construction, the horizontal part 22 of the press fit terminal 20 disposed at the lower end thereof is supported by the stepwise part 12*b* projected from the bottom wall 12*a* of the printed board holding case 12. Therefore by merely pressing the press fit terminals 20 into the terminal holes 31*b*, 32*b*, and 33*b* of the first through third printed boards 31, 32, and 33, the electric conductor 31*a* of the first printed board 31 and the electric conductor 32*a* of the second printed board 32 and the electric conductor 32*a* of the second printed board 32 and the electric conductor 33*a* of the third printed board 33 can be connected to each other respectively. Thereby it is unnecessary to solder the first through third printed boards 31, 32, and 33 and the press fit terminals 20 to each other in connecting them to each other and possible to facilitate the above-described connection work.

Because the peripheral portion of the upper printed board is projected beyond the peripheral portion of the lower printed board, and the terminal holes are formed on the projected portion, the first vertical part 21 of the press fit terminal 20 connected with the electric conductor of the upper printed board and the lower printed board do not interfere with each other. Thereby it is unnecessary to form a through-hole for inserting the first vertical part therethrough on the lower printed board. Further only the press fit portions 24, 25 of the first vertical part 21 and the second vertical part 23 are pressed into the terminal holes of the printed board. Therefore it is possible to facilitate the connection of the press fit terminal 20 to the printed boards.

Further because it is easy to connect the electric conductors of the printed boards to each other, a plurality of the printed boards can be accommodated inside the electric junction box. Thus the electric junction box is allowed to have a high density, be compact, and have a low cost.

Figure 7:
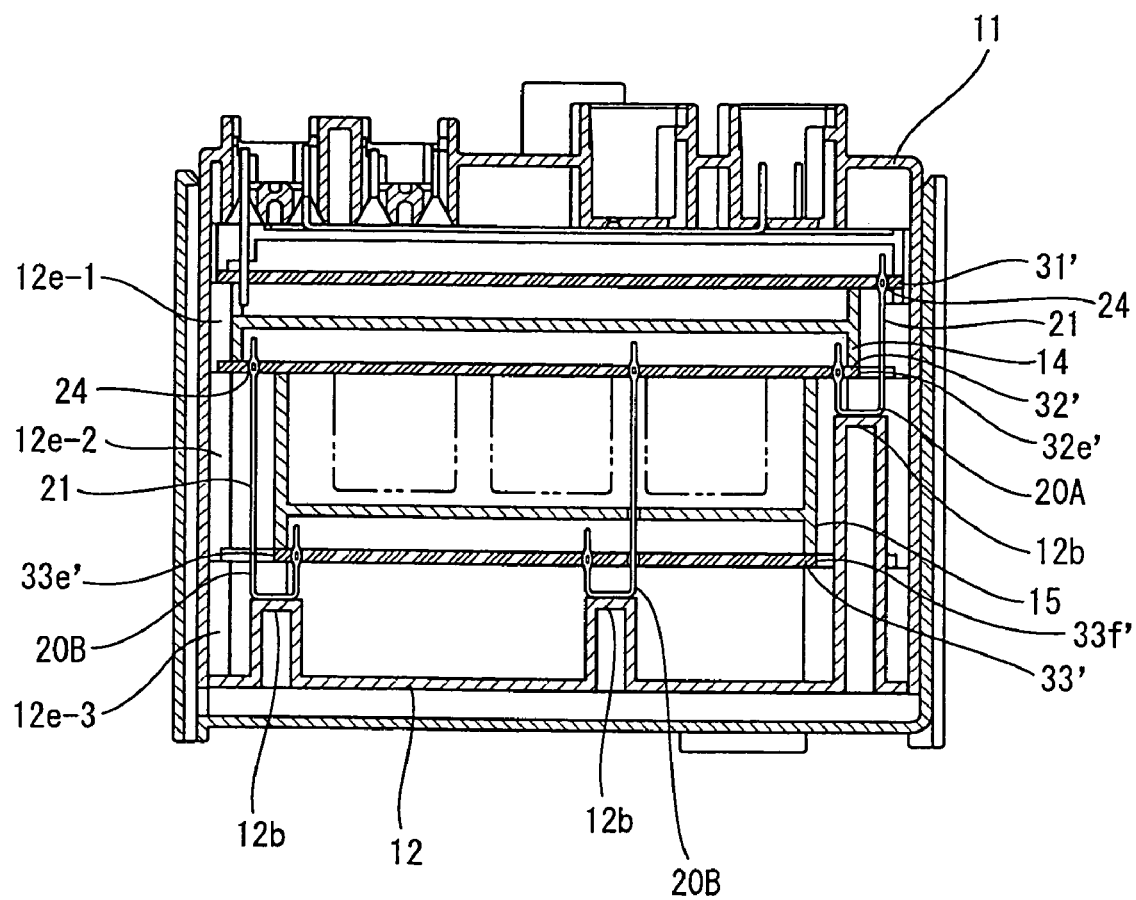
FIG. 7 is a sectional view of an electric junction box of a modification of the first embodiment.
Figure 8:
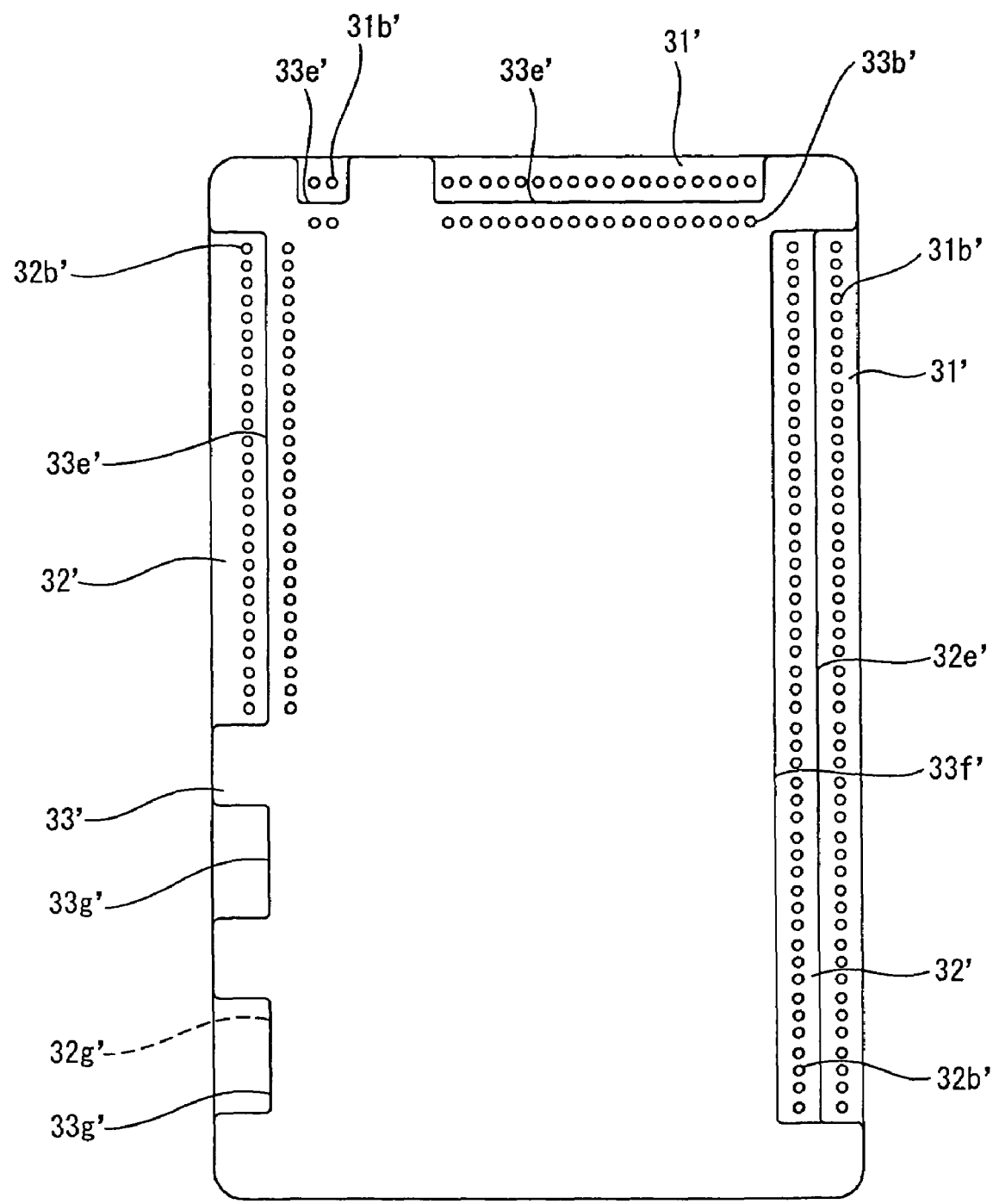
FIG. 8 is a bottom view showing a state in which first through third printed boards of a modification of the first embodiment are disposed.
Figure 9A:
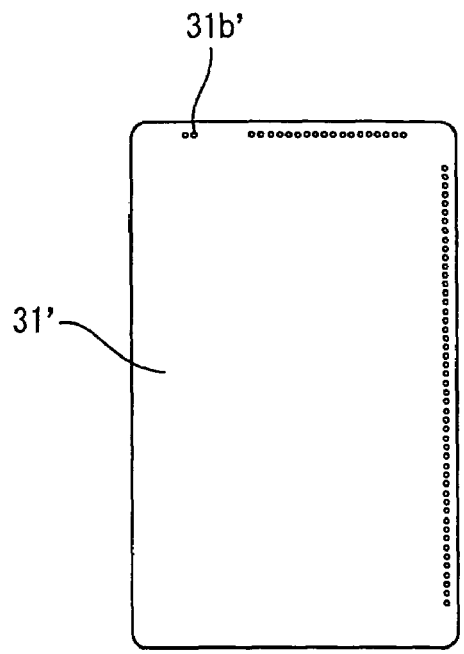
FIG. 9 shows the printed boards of the modification of the first embodiment, in which (A) is a bottom view of the first printed board, (B) is a bottom view of the second printed board, and (C) is a bottom view of the third printed board.
Figure 9B:
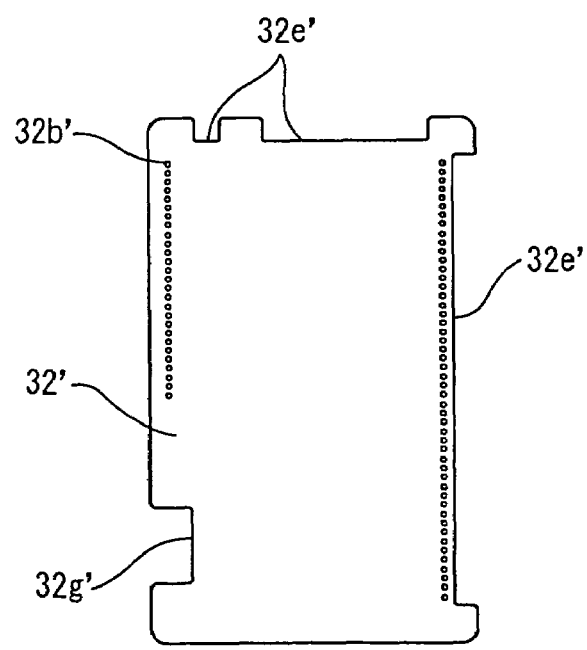
Figure 9C:
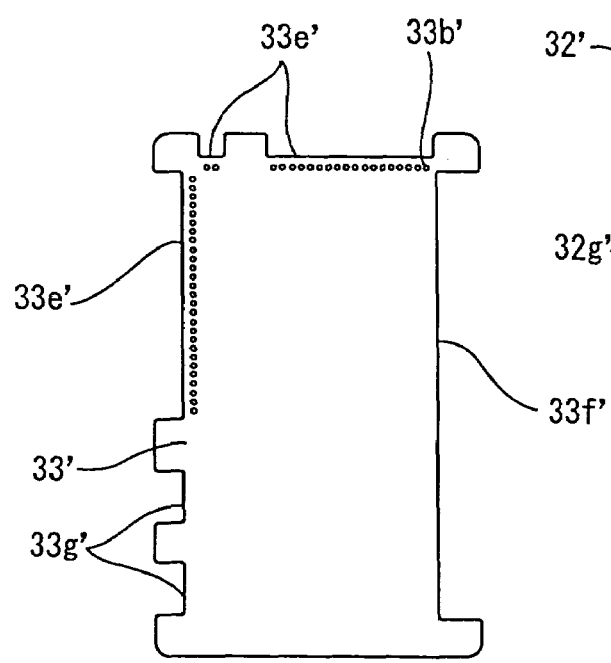

FIGS. 7 through 9 show a modification of the first embodiment in which first through third printed boards 31', 32', and 33' accommodated inside a box composed of the upper case 11 and the printed board holding case 12 have an equal size.

As shown in FIGS. 8 and 9, terminal holes 31b', 32b', and 33b' are formed on the first through third printed boards 31', 32', and 33' at the same positions as the positions where the terminal holes are formed on the first through third printed boards 31, 32, and 33 of the first embodiment. Cut-off portions 32e' and 33e' through which the first vertical part 21 of the press fit terminal 20 are inserted are formed on the second and third printed boards 32' and 33' respectively. Formed on the third printed board 33' is a cut-off portion 33f' through which a stepwise part 12b supporting from below a lower side of the press fit terminal 20A connecting the first printed board 31' and the second printed board 32' to each other is inserted. Formed on the second and third printed board 32', 33' are cut-off portions 32g', 33g' through which supporting ribs 12e-1 through 12e-3 supporting the first through third printed board 31', 32', and 33' from below are inserted.

By mounting the first through third printed boards 31', 32', and 33' on the first and second intermediate cases 14, 15, the first through third printed boards 31', 32', and 33' are connected to each other with the press fit terminals 20. When the first through third printed boards 31', 32', and 33' connected to each other are accommodated inside the box, as shown in FIG. 7, the first vertical part 21 of the press fit terminal 20 passes through the cut-off portions 32e', 33e' of the second and third printed boards 32', 33', and the stepwise part 12b passes through the cut-off portion 33f' of the third printed board 33' and supports the press fit terminal 20 from below. Further the supporting ribs 12e-1, 12e-2 pass through the cut-off portions 32g', 33g' of the second and third printed boards 32' and 33' respectively, and the supporting ribs 12e-1 through 12e-3 support the first through third printed boards 31', 32', and 33' from below.

The above-described construction allows the press fit portion 24 of the first vertical part 21 of the press fit terminal 20 to be pressed into the terminal hole of the upper printed board without inserting the press fit portion 24 of the first vertical part 21 of the press fit terminal 20 into the terminal hole of the lower printed board. Thereby it is possible to connect the electric conductors of the first through third printed boards 31', 32', and 33' to each other easily by using the press fit terminals 20.

Other constructions of the modification are similar to those of the above-described embodiment. Thus the description thereof is omitted herein.

Figure 10:
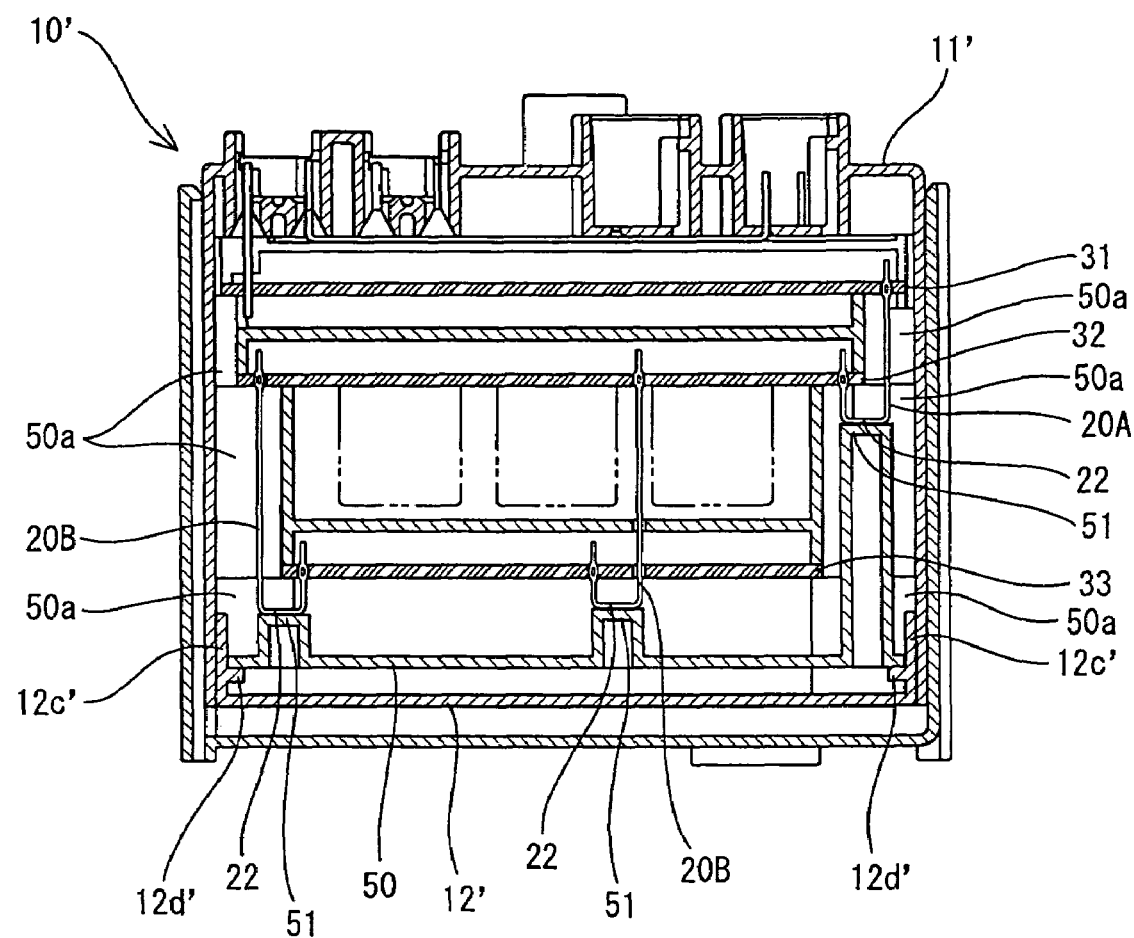
FIG. 10 is a sectional view of an electric junction box of a second embodiment.

FIG. 10 shows the second embodiment of the present invention. An electric junction box 10' is different from the electric junction box 10 of the first embodiment in the construction of supporting the press fit terminal connecting electric conductors of printed boards to each other.

The electric junction box 10' composed of an upper case 11' and a printed board holding case 12' accommodates first through third printed boards 31, 32, and 33 similar to those of the first embodiment. Electric conductors 31a, 32a, and 33a of the first through third printed boards 31, 32, and 33 are connected to each other with press fit terminals 20A, 20B similar to those of the first embodiment.

A projected portion 12d' for supporting a partitioning wall is projected from a peripheral wall 12c' of the printed board holding case 12' toward the inside of the box. A partitioning wall 50 accommodated inside the case, with its peripheral edge placed on the projected portion 12d' partitions the inside of the box into the side of the upper case 11 and the side of the printed board holding case 12. A required portion of the partitioning wall 50 is projected upward to form a stepwise part 51. The stepwise part 51 is in contact with the horizontal part 22 of the press fit terminal 20 and supports the press fit terminal 20 from below. A supporting rib 50a supporting the first through third printed boards 31, 32, and 33 from below is projected from the partitioning wall 50.

Because the above-described construction allows the horizontal part 22 disposed at the lower end of the press fit terminal 20 to be supported by the stepwise part 51 projected from the partitioning wall 50 accommodated inside the box, it is unnecessary to perform soldering in connecting the press fit terminal 20 and the first through third printed boards 31, 32, and 33 to each other. Thereby it is possible to facilitate the connection work. When the disposition of the press fit terminal 20 is changed owing to alteration of a circuit, only the change of the configuration of the partitioning wall 50 is necessary in dependence on a changed position of the press fit terminal. Therefore it is unnecessary to newly provide the electric junction box with the printed board holding case.

Other constructions of the modification are similar to those of the above-described embodiment. Thus the description thereof is omitted herein.

Figure 11:
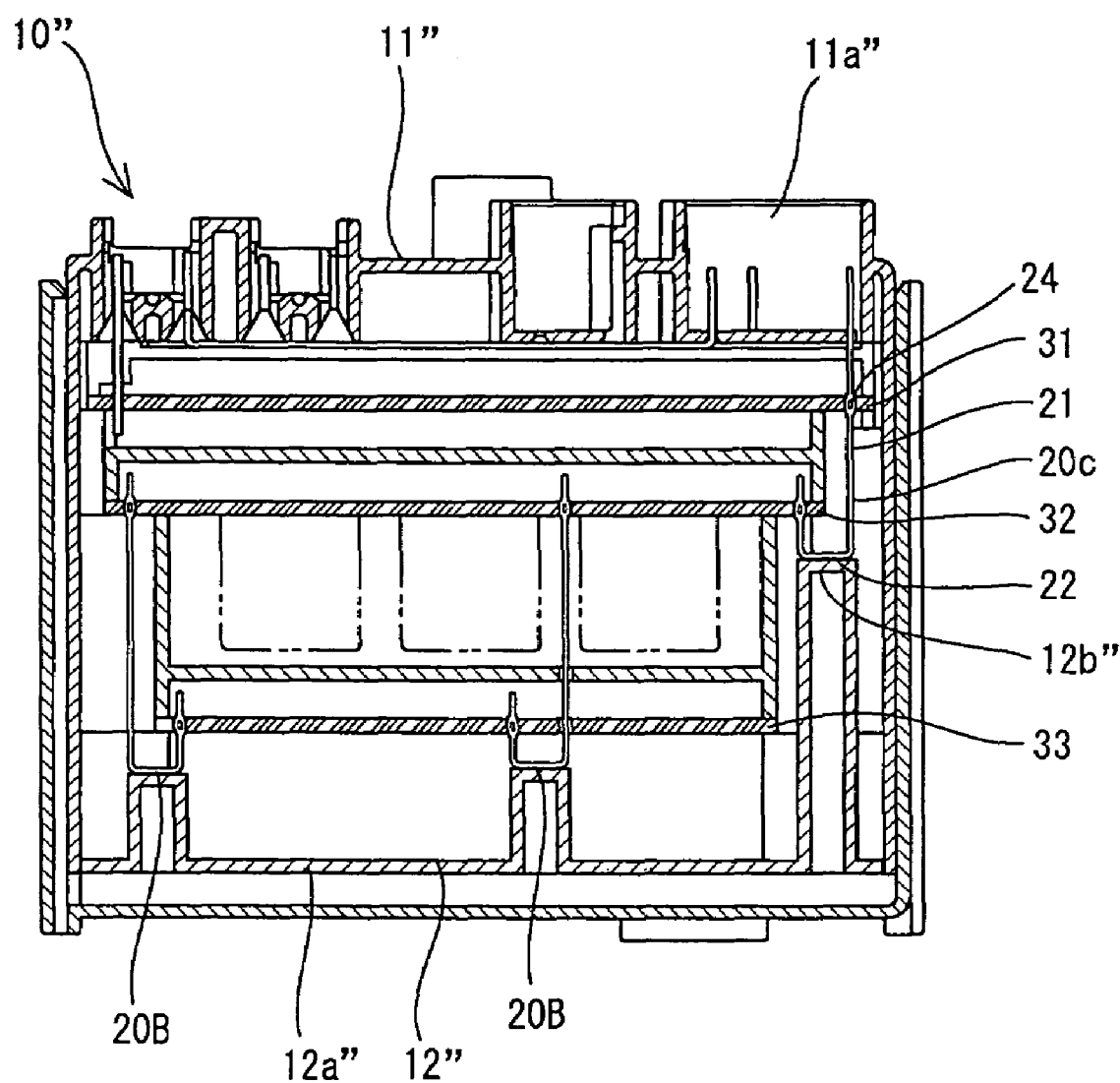
FIG. 11 is a sectional view of an electric junction box of a third embodiment.

FIG. 11 shows the third embodiment of the present invention. An electric junction box 10" composed of an upper case 11" and a printed board holding case 12" accommodates first through third printed boards 31, 32, and 33 similar to those of the first embodiment. Electric conductors 31a, 32a, and 33a of the first through third printed boards 31, 32, and 33 are connected to each other with press fit terminals 20C, 20B similar to those of the first embodiment.

The press fit terminal 20C connecting the electric conductor of the first printed board 31 and that of the second printed board 32 to each other is set longer than the press fit terminal 20A in the length between the press fit portion 24 and the leading end thereof. The leading end of the press fit terminal 20C is projected into a connector accommodation part 11a" of the upper case 11" and connected to a connector (not shown) of an external circuit, with the press fit portion 24 pressed into the terminal hole of the first printed board 31.

In the above-described construction, when the connector connected with the external circuit is fitted in the connector accommodation part 11a" of the upper case 11", the leading end of the press fit terminal 20C projected into the connector accommodation part 11a" is fitted in a female terminal inside the connector, with a load applied to the press fit terminal 20C from above. But the horizontal part 22 disposed at the lower end of the press fit terminal 20C is supported by the stepwise part 12b" projected from a bottom wall 12a" of the printed board holding case 12". Therefore the press fit terminal 20C is not removed from the terminal holes of the printed boards. Thereby it is possible to improve the reliability in the electrical connection.

Other constructions of the modification are similar to those of the above-described embodiment. Thus the description thereof is omitted herein.

Figure 12:
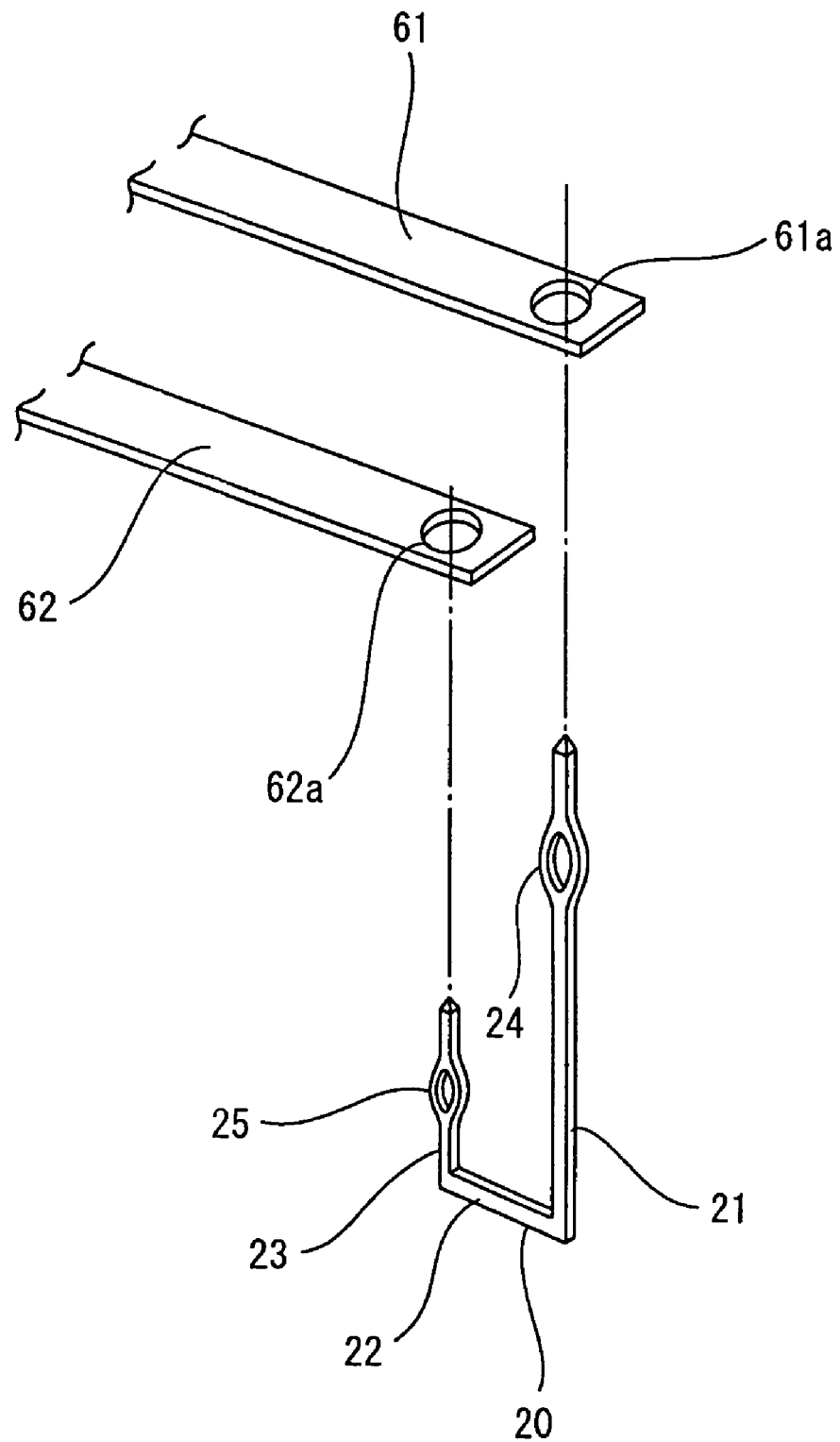
FIG. 12 is a sectional view of an electric junction box of a fourth embodiment.
Figure 13:
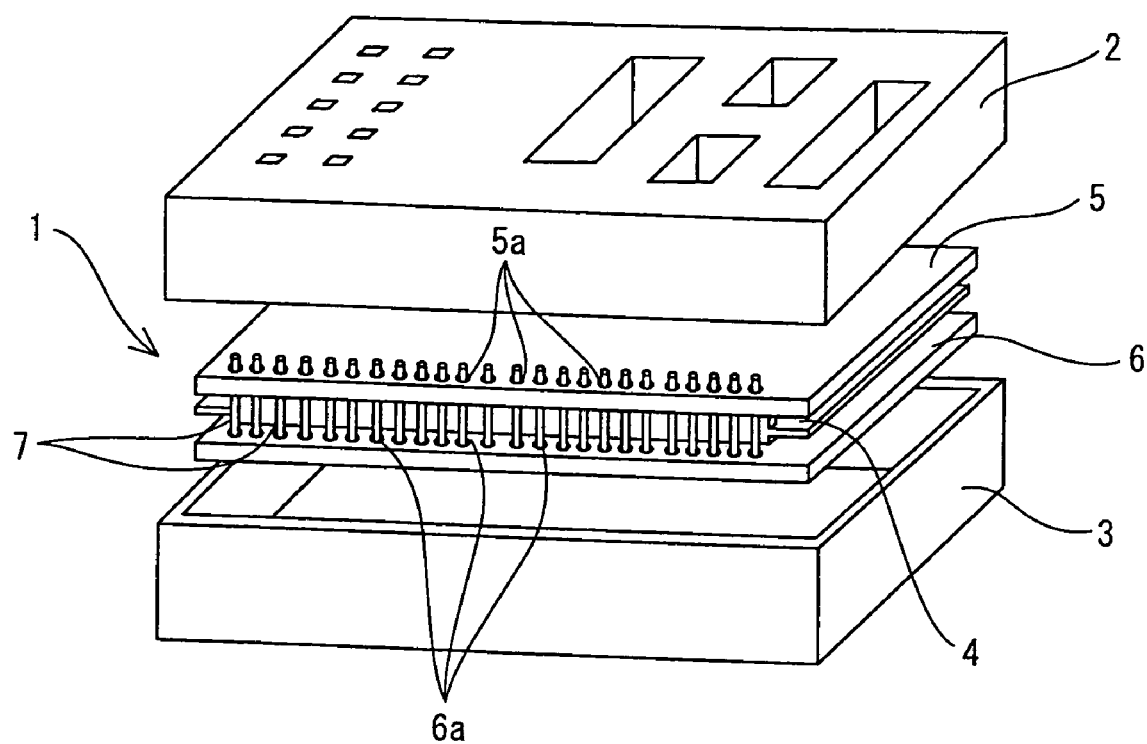
FIG. 13 shows an example of a conventional art.

FIG. 12 shows the fourth embodiment of the present invention. The press fit terminal 20 similar to that of the first embodiment is pressed into terminal holes 61a, 62a of a first bus bar 61 and a second bus bar 62 disposed vertically, with the first bus bar 61 and the second bus bar 62 spaced at an interval. Thereby the bus bars are connected to each other. More specifically, the press fit portion 24 of the longer first vertical part 21 is pressed into the terminal hole 61a of the first bus bar 61 located at an upper position, whereas the press fit portion 25 of the shorter second vertical part 23 is pressed into the terminal hole 62a of the second bus bar 62 located at a lower position.

In the above-described construction, without soldering, the bus bars can be connected to each other by using the press fit terminal 20.

The invention claimed is:

1. A press fit terminal for electrically connecting electric conductors of printed boards spaced at an interval to each other, electric conductors of said printed boards and bus bars to each other or said bus bars to each other,
   wherein said press fit terminal is formed by bending a rod-shaped material made of conductive metal and has a long first vertical part, a horizontal part bent at a lower end of said first vertical part and extended in parallel with said printed boards or said bus bars, and a short second vertical part bent upward at a leading end of said horizontal part and extended in confrontation with said first vertical part; and
   an upper portion of said first vertical part is set as a press fit portion to be pressed into a terminal hole of said printed board or a terminal hole of said bus bar disposed at an upper position, and an upper portion of said second vertical part is set as a press fit portion to be pressed into a terminal hole of said printed board or a terminal hole of said bus bar disposed at a lower position.

2. The construction of connecting printed boards by using a press fit terminal, wherein by using a press fit terminal according to claim 1, forming a conductive layer connected with an electric conductor on an inner peripheral surface of a terminal hole of each of said printed boards, and pressing said press fit portions of said press fit terminal into said terminal holes, said press fit terminal is electrically connected with said electric conductors of said printed boards.

3. The construction of connecting printed boards by using a press fit terminal according to claim 2, wherein in said printed boards, a peripheral portion of said upper printed board is projected outward beyond a peripheral portion of said lower printed board, and said electric conductors, provided with said terminal holes respectively, are arranged side by side on said upper and lower printed boards along peripheries thereof;
   a plurality of said press fit terminals are arranged in a row along said peripheral portions of said printed boards, and with a first vertical part of each of said press fit terminals disposed outside and a second vertical part thereof disposed inside, said press fit terminals are pressed into said terminal holes of said upper and lower printed boards from below in such a way that said press fit portion of said second vertical part of each press fit terminal is pressed into and brought into contact with one of said terminal holes formed on said periphery of said lower printed board and that said press fit portion of said first vertical parts of each press fit terminal is pressed into and brought into contact with one of said terminal holes formed on said periphery of said upper printed board.

4. The construction of connecting printed boards by using a press fit terminal according to claim 2, wherein said printed boards have an equal size; a cut-off portion through which said first vertical part of said press fit terminal is inserted is formed on said lower printed board; and electric conductors having said terminals holes formed thereon respectively are arranged side by side along said peripheries of said upper and lower printed boards or said cut-off portions,
   a plurality of said press fit terminals are arranged in a row along said peripheral portions of said printed boards, and with a first vertical part of each of said press fit terminals disposed outside and a second vertical part thereof disposed inside, said press fit terminals are pressed into said terminal holes of said upper and lower printed boards from below in such a way that said press fit portion of said second vertical part of each press fit terminal is pressed into and brought into contact with one of said terminal holes formed on said periphery of said lower printed board, that a lower portion of said press fit portion of said first vertical part of each of said press fit terminals is inserted through said cut-off portion, and that each of said press fit portions is pressed into and brought into contact with one of said terminal holes formed on said periphery of said upper printed board.

5. The electric junction box accommodating printed boards connected to each other with press fit terminals according to claim 3, wherein a horizontal part of each of said press fit terminals is supported with a stepwise part projected from a bottom wall of a printed board holding case or a stepwise part projected from a partitioning wall formed inside said electric junction box; and said printed boards are supported with a supporting rib projected from said bottom wall of said printed board holding case or a supporting rib projected from said partitioning wall formed inside said electric junction box.

6. The electric junction box accommodating printed boards connected to each other with press fit terminals according to claim 4, wherein a horizontal part of each of said press fit terminals is supported with a stepwise part projected from a bottom wall of a printed board holding case or a stepwise part projected from a partitioning wall formed inside said electric junction box; and said printed boards are supported with a supporting rib projected from said bottom wall of said printed board holding case or a supporting rib projected from said partitioning wall formed inside said electric junction box.

* * * * *